United States Patent [19]

Awakowicz et al.

[11] Patent Number: 4,758,168

[45] Date of Patent: Jul. 19, 1988

[54] CONTACT DEVICE COMPOSED OF A PLUG AND A CORRESPONDING SOCKET

[75] Inventors: Erwin Awakowicz, Munich; Peter Kleine, Fischen, both of Fed. Rep. of Germany

[73] Assignee: Siemens Aktiengesellschaft, Berlin and Munich, Fed. Rep. of Germany

[21] Appl. No.: 886,084

[22] Filed: Jul. 16, 1986

[30] Foreign Application Priority Data

Jul. 29, 1985 [DE] Fed. Rep. of Germany ....... 3527142

[51] Int. Cl.$^4$ .............................................. H01R 9/09
[52] U.S. Cl. ........................................ 439/83; 29/843
[58] Field of Search ................. 339/17 R, 17 C, 17 D, 339/17 L, 17 LM, 17 M, 17 LC, 126 R, 126 J; 29/837, 839, 840, 842, 843, 844, 845; 439/55, 78-85

[56] References Cited

U.S. PATENT DOCUMENTS

| | | | |
|---|---|---|---|
| 3,079,582 | 2/1963 | Lazar | 339/258 R |
| 3,871,728 | 3/1975 | Goodman | 339/17 R |
| 4,287,667 | 9/1981 | Urushiyama | 29/837 |
| 4,396,242 | 8/1983 | Kurano et al. | 339/17 C |

FOREIGN PATENT DOCUMENTS 3329650  3/1985  Fed. Rep. of Germany .
970005   9/1964  United Kingdom ........ 339/17 LM

OTHER PUBLICATIONS

IBM Bulletin, Allen, vol. 19, No. 1, p. 51, 6-1976.

Primary Examiner—Neil Abrams
Attorney, Agent, or Firm—Hill, Van Santen, Steadman & Simpson

[57] ABSTRACT

A contact device for plugs is arranged on the component side of the printed circuitboard and includes soldered connections which penetrate through the printed circuitboard and are soldered to conductor paths of the printed circuitboard on the opposite side thereof. The countercontacts of a plug can be inserted from the soldering side of the printed circuitboard and penetrate through a recess through the printed circuitboard. The purpose of the invention is to provide a contact device which can be applied together with the components from one side of the printed circuitboard by way of an automatic equipping machine. Accordingly, at least one plug receptacle forms the contact device. The plug receptacle includes two flanks which serve for mechanical and electrical fastening to the printed circuitboard and between which a plug tongue is arranged for contacting the respective countercontact of the plug.

5 Claims, 1 Drawing Sheet

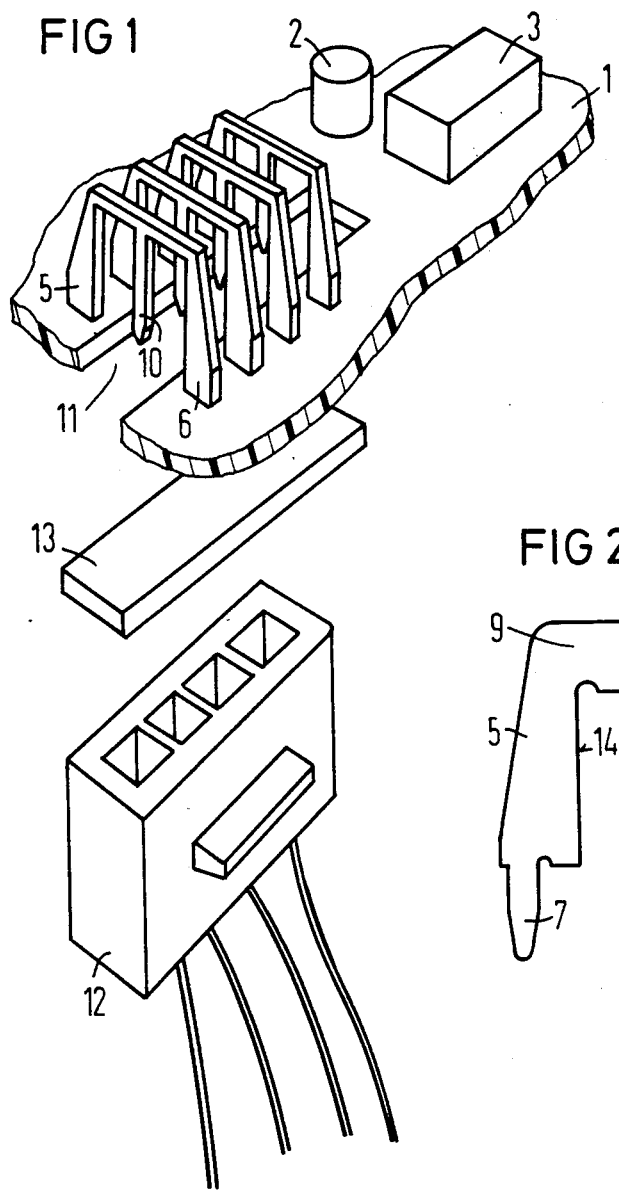

CONTACT DEVICE COMPOSED OF A PLUG AND A CORRESPONDING SOCKET

BACKGROUND OF THE INVENTION

1. Field of the Invention

The present invention relates to a contact device which is arranged on the component side of a printed circuitboard and serves for plugs and which, by way of soldered connections, penetrates through openings of the printed circuitboard and electrically and mechanically contacts conductor paths on the rear side of the board, where the countercontacts of the plug, which can be inserted from the soldering side, penetrate through at least one recess in the printed circuitboard, and further relates to a process for the production of the contact device.

2. Description of the Prior Art

A contact device disclosed in the German published application No. 33 29 650 is formed by a clip-shaped component which consists of resilient material and whose flanks abut upon one another on a section of its length and accommodate the countercontact of the plug therebetween. The exposed ends of the component are offset on a section of its length and by way of this section penetrate through bores in the printed circuitboard. The exposed ends are designed as soldering plug pins and are electrically and mechanically connected to conductor paths on the printed circuitboard.

In the above known arrangement, it is to be considered disadvantageous that the soldered joints are strained during the respective insertion of the countercontact, so that during repeated plugging the danger of a break in the soldered joint occurs.

As a result of its outer shape, the production of the component is elaborate and therefore costly. Moreover, these components can only be manufactured individually because their production is effected by way of a bending process. The components are therefore unsuitable for an automatic equipment of printed circuitboards.

SUMMARY OF THE INVENTION

The object of the present invention is to provide a contact device to be such that it can be applied together with the components from one side of a printed circuitboard by way of an automatic equiping machine.

According to the invention, the above object is achieved in that the contact device is constructed to have at least one U-shaped plug receptacle, whereby the exposed ends of the flanks thereof are designed as soldering lugs and where, furthermore, a plug tongue extending in the direction of the printed circuitboard is arranged between the flanks, the plug tongue being arranged in the region of the recess.

The plug receptacles forming the contact device may be inexpensively produced from strip material in a punching process, whereby the soldered end regions of the flanks are only minimally strained during the plugging process. In accordance with a preferred exemplary embodiment, the plug tongue may be arranged so as to extend parallel to the flanks and the inner sides of the flanks, which are arranged opposite one another, form a guide for the plug. A feasible process for the production of the contact device consists in that the recess in the printed circuitboard is formed by punching out a punched component, that the printed circuitboard is equipped with components and the plug receptacles forming the contact device, and that the punched component is pressed back into the recess prior to the soldering process and removed following the soldering process.

BRIEF DESCRIPTION OF THE DRAWING

Other objects, features and advantages of the invention, its organization, construction and operation will be best understood from the following detailed description, taken in conjunction with the accompanying drawing, on which:

FIG. 1 is a perspective, exploded view of a plug receptacle secured to a printed circuitboard and the assigned plug; and FIG. 2 is a side view of the plug receptacle of FIG. 1.

DESCRIPTION OF THE PREFERRED EMBODIMENTS

Referring to the drawing, the plug receptacle 4 is secured to a printed circuitboard 1 which, interalia, serves to accommodate electrical components 2 and 3.

The plug receptacle 4 is U-shaped and its outer flanks 5 and 6 have soldering lugs 7 and 8 at their distal ends, which soldering lugs penetrate through the printed circuitboard and serve for the electrical contacting and fastening of the plug receptacle on the printed circuitboard 1.

A plug tongue 10 is arranged between the flanks 5 and 6 so as to be parallel thereto and so as to extend at right angles to a base 9. The plug tongue 10 extends in the direction of a recess 11 in the printed circuitboard 1. The recess 11 is penetrated by a plug 12. The mutually opposite inner sides 14 and 15 of the flanks 5 and 6 form a guide for the plug 12 in addition to the walls of the recess 11.

The plug 10 is dimensioned to be such that it enters into a contact connection with the countercontacts which are arranged in a plug 12. Depending on the number of countercontacts which are present in a plug, a corresponding quantity of plug receptacles 4 is provided.

When the plug receptacle 4 is fastened in the surge soldering process, the recess 11 is covered by the punched component 13 corresponding thereto in terms of shape and dimension, so that the solder cannot extend to the plug 10. The punched component 13 is then removed after surge soldering.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A contact combination comprising:
   a printed circuitboard including first and second surfaces, a recess therethrough, and at least two openings therethrough each on a respective side of said recess;
   a plurality of electrical components mounted on said first surface and a plurality of conductor paths mounted on said second surface; and
   a U-shaped plug receptacle mounted on said first surface, said plug receptacle comprising a pair of legs each including a distal projection as a soldering lug extending through a respective one of said openings and soldered to selected ones of said conductor paths, and a contact tongue extending towards said recess and formed for receipt into a respective female contact receptacle that has been inserted through the recess.

2. The contact combination of claim 1, wherein:
said legs are parallel and form a plug guide; and
said contact tongue extends between and parallel to said legs.

3. A process for making a contact combination which comprises a printed circuitboard including first and second surfaces, a recess therethrough, and at least two openings therethrough each on a respective side of said recess; a plurality of electrical components mounted on said first surface and a plurality of conductor paths mounted on said second surface; and a U-shaped plug receptacle mounted on said first surface, said plug receptacle comprising a pair of legs each including a distal projection as a soldering lug extending through a respective one of said holes and soldered to selected ones of said conductor paths, and a contact tongue extending towards said recess, comprising the steps of:

punching out a portion of the printed circuitboard to form the recess;

inserting the punched out portion into the recess before soldering;
soldering the distal projections and
removing the punched out portion after soldering the lugs to the conductors.

4. A contact combination comprising:
a printed circuitboard including first and second surfaces, and a recess therethrough;
at least one electrical component mounted on said first surface and a plurality of conductor paths mounted on said second surface; and
a U-shaped plug receptacle mounted on said first surface, said plug receptacle comprising a pair of legs and a crossbar connecting said legs, each of said legs including a distal portion extending through said circuitboard and electrically connected to a respective one of said conductor paths, and a contact tongue extending from said crossbar towards said recess and formed for receipt into a respective female contact receptacle that has been inserted through the recess.

5. The contact combination of claim 4, wherein:
said legs extend parallel to one another and form a plug guide; and
said contact tongue extends from said crossbar between and parallel to said legs.

* * * * *